United States Patent [19]

Andersson et al.

[11] Patent Number: 5,077,638
[45] Date of Patent: Dec. 31, 1991

[54] HEAT SINK FOR AN ELECTRIC CIRCUIT BOARD

[75] Inventors: Bernt Andersson, Jönköping; Hans Danielsson, Linköping; Hans Johansson, Åmål; Håkan Andersen, Vargön, all of Sweden

[73] Assignee: SAAB Automobile Aktienbolag, Sweden

[21] Appl. No.: 476,375

[22] PCT Filed: Oct. 21, 1988

[86] PCT No.: PCT/SE88/00553
§ 371 Date: May 14, 1990
§ 102(e) Date: May 14, 1990

[87] PCT Pub. No.: WO89/04593
PCT Pub. Date: May 18, 1989

[30] Foreign Application Priority Data

Nov. 4, 1987 [SE] Sweden .................. 8704303

[51] Int. Cl.⁵ .................................... H05K 7/20
[52] U.S. Cl. ............................ 361/388; 165/185; 211/41; 361/415
[58] Field of Search .......... 357/81; 361/379, 391, 361/395, 383, 385–388, 400, 403, 415; 174/16.3, 252; 165/80.3, 185; 211/41

[56] References Cited

U.S. PATENT DOCUMENTS

| | | | |
|---|---|---|---|
| 4,361,861 | 11/1982 | Spapens | 361/383 |
| 4,366,526 | 12/1982 | Lijoi | 361/385 |
| 4,674,005 | 6/1987 | Lacz | 361/388 |
| 4,701,829 | 10/1987 | Bricaud | 361/386 |
| 4,707,726 | 11/1987 | Tinder | 357/81 |
| 4,716,498 | 12/1987 | Ellis | 361/395 |
| 4,756,081 | 7/1988 | Penn | 29/832 |
| 4,758,928 | 7/1988 | Wierec | 361/415 |
| 4,890,198 | 12/1989 | Beam | 361/415 |

Primary Examiner—Gerald P. Tolin
Attorney, Agent, or Firm—Ostrolenk, Faber, Gerb & Soffen

[57] ABSTRACT

A heat sink (4) intended for mounting along the edge (3) on an electrical circuit board (1) in order to cool heat-generating components (2) on the circuit board. The heat sink (4) is designed with on the one hand a longitudinal slot (5) for mounting on the circuit board (1) and on the other hand a mounting flange (6) located in substantially the same plane as the slot (5). The design of this mounting flange (6) means that a circuit board (1) provided with a heat sink (4) can be mounted in guide tracks or equivalent in the same manner as a circuit board (1) without heat sink (4). The design of the heat sink (4) also means that the same heat sink (4) can be used for different circuit boards (1) and different components (2).

20 Claims, 2 Drawing Sheets

HEAT SINK FOR AN ELECTRIC CIRCUIT BOARD

BACKGROUND OF THE INVENTION

The invention relates to a heat sink for an electric circuit board on which is mounted at least one heat-generating component which requires cooling.

One of the most frequently used methods of designing such a heat sink is to adapt the heat sink to a certain particular component, the heat sink being fixed to the actual component upon assembly. A circuit board can thus come to include a number of different heat sinks positioned in different places on the circuit board. The work of mounting these heat sinks on the respective different components is both extensive and expensive. The scattered positioning on the circuit board of the heat sinks means that special arrangements are required in order to supply cooling air to the heat sink, which in turn results in difficulties in positioning other electronic components closer to one another on the circuit board. In the event that it is desired to position a number of circuit boards close to one another, the positioning of the heat sinks prevents these circuit boards being positioned near one another.

With a view to simplifying the mounting of the heat-generating components on a heat sink, it is known through U.S. Pat. No. 4,674,005 to arrange one heat sink which is common to several components. In this connection the heat sink extends along the one edge of the circuit board and is screwed securely on its upper side. The heat-generating components are gathered along the edge of the circuit board and under the bias of a common tensioning element bear against the heat sink. Arranging a common heat sink for several components in this manner certainly leads to advantages, but also to disadvantages. The heat sink is screwed securely to a housing enclosing the circuit board for transfer of the heat to the housing. This can be simply arranged if there is only one circuit board which is to be connected to the housing in this manner. In the event that the housing is to contain a number of circuit boards, no indication is given as to how this is to be arranged.

International patent specification WO86/06334 shows how a number of circuit boards are arranged in a common housing. In this case the heat sinks are designed as base plates, which extend parallel to the respective circuit boards. The base plates are at their sides connected to the housing for further transfer of the heat. However, this design requires a relatively complicated join between the base plates which serve as heat sinks and their connection in the housing. This means that this arrangement also can be considered as complicated.

SUMMARY OF THE INVENTION

The aim of the invention is to make possible in a simpler and cheaper manner than known solutions the connection between a heat sink and a circuit board. It is also the aim of the invention to allow a number of circuit boards with heat sinks to be simply mounted in the same housing. These aims are achieved according to the invention by the arrangement being designed with an electric circuit board on which is mounted at least one heat-generating component which requires cooling and which circuit board cooperates with and is mounted to a heat sink, according to the invention. The heat-generating component is mounted to the circuit board and also is electrically connected to the circuit board and the heat-generating component is also connected to the heat sink for heat transfer from the component to the heat sink. The circuit board and the heat sink together form a mountable unit.

The heat sink has a first side that includes a slot defined in it. The circuit board has a first side edge that is received in the slot of the heat sink. The slot and the circuit board edge are correspondingly shaped. A second side of the heat sink, and particularly its opposite side, has a projecting mounting flange located on it which extends longitudinally along the second side. The mounting flange is mountable in a mounting track for the flange. Preferably, the mounting flange on the heat sink and the slot in the heat sink extend substantially in the same plane. Preferably further, the circuit board is in that plane.

Additionally, the heat sink has longitudinal cooling flanges extending along it which are shaped for increasing the surface area of the heat sink. The heat sink is an extruded profile, preferably of extruded aluminum, and it has substantially the same cross-sectional shape along its longitudinal length. Preferably, the cooling flanges project above one side of the heat sink. The opposite side of the heat sink is a contact surface, and particularly a flat contact surface, on which the heat-generating component is held. A tensioning element, secured to the heat sink, holds the heat-generating component to the contact surface of the heat sink. Holding means hold the circuit board and the heat sink securely to each other. Those means may include recesses formed in the part of the circuit board that is inserted in the slot in the heat sink, and deformed areas of ht heat sink are received in those recesses in the circuit board.

A heat sink which according to the invention is designed with a slot for the one side edge of the circuit board makes it possible for the heat sink to be simply fixed to the circuit board. By virtue of the heat sink being designed with an external mounting flange, simple mounting of the circuit board with the heat sink in conventional mounting tracks is made possible.

BRIEF DESCRIPTION OF THE DRAWINGS

Further features and advantages which characterize the invention are given in the following exemplary description, which is carried out with reference to the attached drawings. Of these

DESCRIPTION OF A PREFERRED EMBODIMENT

Figure 1:
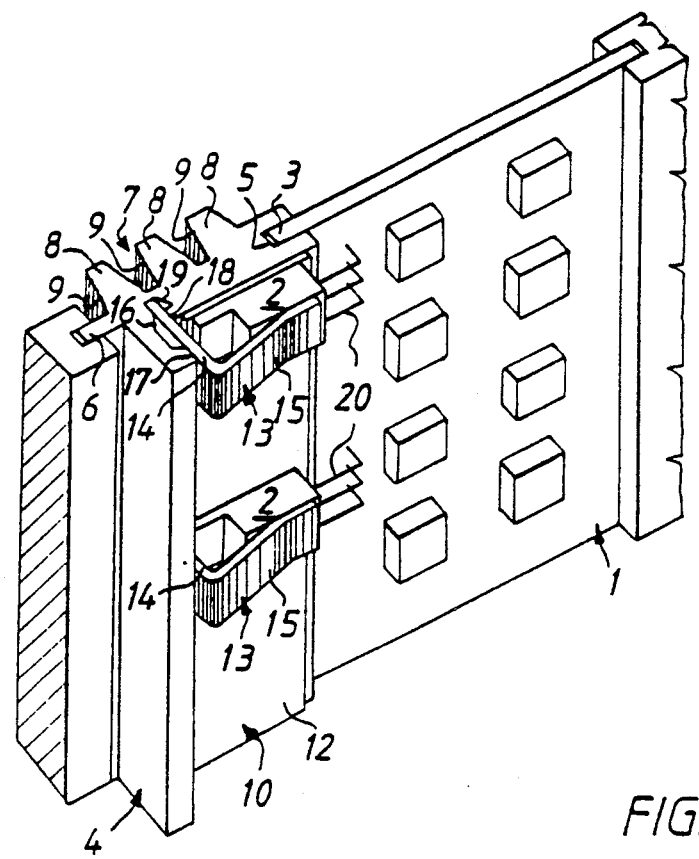
FIG. 1 shows a perspective view of a circuit board provided with a heat sink and mounted in mounting tracks.
Figure 2:
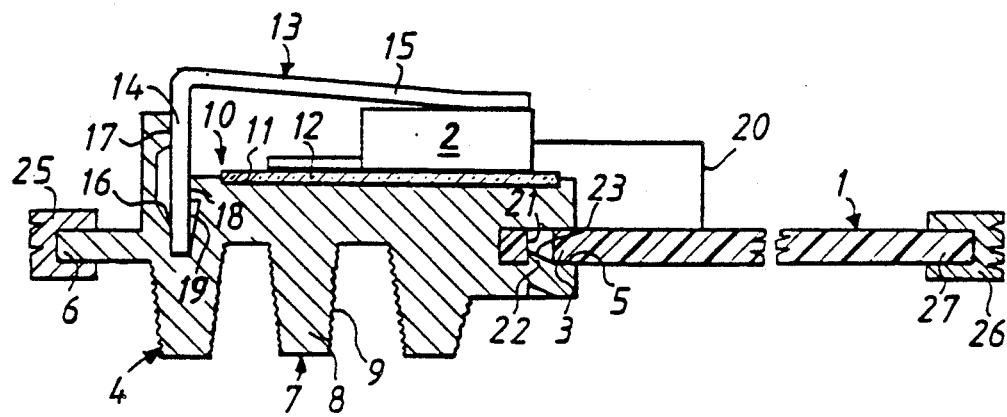
FIG. 2 shows a horizontal cross sectional view of the circuit board according to FIG. 1.

FIG. 1 shows a per se conventional circuit board 1 on which is mounted a number of electronic components. The components 2 which are heat-generating and require cooling are gathered along the one side edge 3 of the circuit board 1. Along the said side edge 3, there is also fixed a heat sink 4 according to the invention, which extends substantially along the entire side edge 3 of the circuit board 1. The heat sink 4 comprises an extruded aluminium profile and has substantially the same cross sectional shape along its entire length. The cross sectional shape of the heat sink 4 is shown in FIG. 2. Along its one side edge the heat sink 4 is designed with a slot 5 in which the edge 3 of the circuit board 1 fits and is fixed in a manner which is more closely described later in the description. The heat sink 4 is, on the side edge opposite the slot 5, designed with a longitudinal mounting flange 6, which lies in the same plane as the slot 5 and thus also of the circuit board 1. The width of the flange 6 corresponds to the width of the slot 5, which both correspond to the thickness of the circuit board 1. The outer shape of the flange 6 thus corresponds substantially to the shape of the side edge 3 of the circuit board.

The heat sink 4 is designed along a lower side 7 with a number of longitudinal cooling flanges 8. According to this example the heat sink 4 comprises three cooling flanges 8, which are designed as double flanges. By double flanges is meant that each respective cooling flange 8 is in turn designed with a number of smaller cooling flanges 9 over the surface of the flanges. The heat transferring surfaces of the heat sink 4 are thus larger and the cooling more effective.

The heat sink 4 is designed along an upper side 10 with a flat surface 11, which is parallel to the plane of the circuit board 1. Bearing against the flat surface 11 is a sheet 12 of a ceramic material, which both is electrically insulating and has good heat transfer properties. Bearing against the sheet 12 under spring pressure are the heat-generating components 2 which are to be cooled. The spring pressure is achieved by means of a tensioning element for each component 2, which tensioning element is designed as a spring 13. Each spring 13 is of a similar design.

Each spring 13 comprises a plate spring which is bent at an angle so that two legs 14, 15 are formed. The one leg 14 fits and is mountably fixed in a longitudinal slot 16 in the upper side 10 of the heat sink 4. The second leg bears resiliently against the respective component 2 and presses it towards the sheet 12. In this manner both the component 2 and the sheet 12 are held in position on the heat sink 4.

The slot 16 of the heat sink 4 for mounting of such plate springs 13 comprises on the one hand a longitudinal supporting surface 17 and on the other hand a longitudinal supporting heel 18, which are arranged on opposite sides in the slot 16. Each plate spring 13 is also designed with a resilient tip 19 which is bent outwards. Upon mounting of the plate spring 13 in the slot 16, the sheet 12 and the component 2 are first positioned on the heat sink 4. Subsequently the one leg 14 of the plate spring 13 is guided down in the slot 16 while its other leg 15 bears against the component 2.

Upon mounting, the tip 19 of the spring 13 makes resilient contact with the supporting heel 18, as a result of which a dimensionally stable locking is created which prevents the plate spring 13 being lifted out of the slot 16 again. At the same time the one leg 14 of the plate spring 13 makes supporting contact with the supporting surface 17. The spring 13 is in this connection dimensioned so as to be pressed with suitable force against the component 2 in order to be able to hold it in position. Removal of the spring 13 can if required be simply performed by moving the plate spring 13 sideways in the slot 16 to the end of the slot 16.

As the slot 16 has the same shape along its entire length, it is possible to fix the components 2 with optional positioning along the heat sink 4. This also brings the advantage that identical heat sinks 4 can be used for different circuit boards 1 on which the components 2 have different relative positioning.

Each component 2 comprises in a per se conventional manner connections 20, which are soldered securely on the circuit board 1. Upon mounting of the components 2 on the heat sink the connections 20 have been bent at an angle.

FIG. 2 shows additionally how the join between the circuit board 1 and the heat sink 4 is arranged. The side edge 3 of the circuit board 1 which fits in the slot 5 of the heat sink 4 is designed with a number of, for example four, round holes 21. Directly in front of the holes 21 the heat sink 4 has been subjected to a stamping process in which the heat sink 4 has been partially deformed and pressed down into the respective holes 21. Advantageously this stamping process is carried out in such a manner that a tip 22 with an angled edge 23 is pressed into the hole 21. The angled edge 23 ensures positioning between the circuit board 1 and the heat sink 4. In order to further improve the positioning, the stamping should be carried out in such a manner that the angled edge 23 is given different orientations in the different holes 21.

A heat sink 4 designed according to the invention and fixed to a circuit board 1 constitutes a unit which can be simply handled and mounted in a protective housing or similar. Such a board 1 can advantageously be fixed in fixed mounting tracks 25, 26 in the housing, which tracks 25, 26 are per se well-known for mounting circuit boards.

In FIG. 2, therefore, the tracks are shown in principle only. In this connection the flange 6 of the heat sink 4 fits in the one mounting track 25 while an opposite side edge 27 of the circuit board 1 fits in an opposite mounting track 26. In such a pair of mounting tracks 25, 26 it is alternatively possible to mount in a per se conventional manner a circuit board without a heat sink. Such a circuit board must of course be somewhat larger than the circuit board which is provided with a heat sink in order to fit in the same pair of mounting tracks. In spite of this, it is clear that the invention affords possibilities for simplified and standardized forms of mounting of circuit boards. These advantages become more manifest, the more circuit boards there are to be mounted.

Figure 3:
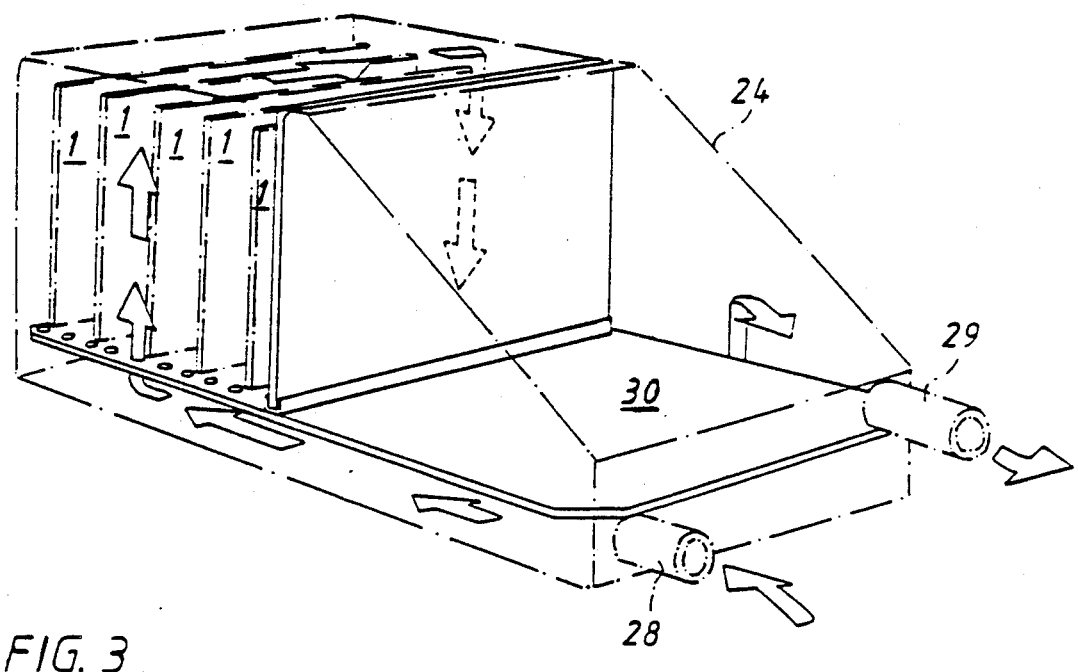
FIG. 3 shows in principle a perspective view of how cooling ventilation is achieved around a number of circuit boards which are provided with heat sinks and mounted in a housing.

FIG. 3 shows a perspective view of how a number of circuit boards 1 can be arranged in a common housing 24. In order to make FIG. 3 clearer, however, the circuit boards 1 and the housing 24 are shown only schematically. The housing 24 may, for example, be intended for mounting in a vehicle and the circuit boards 1 may form part of an electronic unit for control of different functions of the vehicle and its drive engine. The housing 24 comprises an inlet 28 for cooling ventilation air and an outlet 29 for removal of the cooling air from the housing 24. The circuit boards 1 are arranged parallel to one another and all the circuit boards 1 are mounted on and electrically connected to a so-called mother board 30. This comprises a circuit board which, among other things, supplies voltage to different components on the respective circuit boards 1. The mother board 30 is securely screwed in the bottom of the housing and extends perpendicularly in relation to the circuit boards 1. The respective heat sinks 4 of the circuit boards 1 are gathered along the same side as the inlet 28 and the housing 24 is moreover designed so that a favourable flow of air is obtained around the respective heat sinks 4. As the heat sinks 4 are gathered in the same place in the housing 24, it is possible to obtain good cooling of all the heat sinks 4. The heat sinks 4 are advantageously located nearer the inlet 28 than the outlet 29.

The air intended for cooling can advantageously be conducted from the ordinary ventilation system of the vehicle (not shown), in which there is usually access to filtered air with a certain overpressure. In the event that the ventilation system of the vehicle also includes a compressor-controlled cooling system, it is possible to simply conduct cooled air to the inlet 28 of the housing 24. Similarly, it is possible, when the external temperature is low, to conduct warmed air to the housing 24. By collecting cooling air for the housing 24 in this manner from the ordinary ventilation system of the vehicle, the temperature in the housing 24 can be kept at approximately the same level irrespective of the external temperature. This also means that the electrical components mounted on the circuit boards 1 have favourable operating conditions.

The invention is not limited to the exemplary embodiment but can within the framework of the following patent claims be used in alternative embodiments.

In the aforementioned example it is described how a heat sink is fixed along one side of a circuit board. In certain cases, more sides of the circuit board can be provided with heat sinks.

The mounting tracks 25, 26 in which the circuit boards 1 are mounted do not need to be designed as longitudinal tracks. In alternative embodiments these can be designed as fastening elements which only grip the circuit board and the heat sink along a part of their respective edges.

We claim:

1. A heat sink for an electric circuit board, wherein at least one heat generating component which requires cooling is mounted on the circuit board, the heat sink being so shaped and the component being so located on the circuit board that the heat generating component is connected to the heat sink for heat transfer from the component to the heat sink;

means joining the circuit board and the heat sink together for forming a mountable unit, the heat sink having a first side, the joining means comprising a slot defined in and extending along the first side of the heat sink, the slot having a first width across the slot; the circuit board having a side edge having the first width of the slot and being fitted into the slot of the heat sink;

the heat sink having a second side away from the first side, a mounting flange defined on the second side of the heat sink, wherein the mounting flange on the second side and the slot in the first side of the heat sink extend substantially in the same plane.

2. The heat sink of claim 1, wherein the circuit board also extends substantially in the same plane as the mounting flange and the slot.

3. The heat sink of claim 2, wherein the second side of the heat sink is opposite the first side and the mounting flange projects in the same direction as the direction that the slot extends into the first side of the heat sink.

4. The heat sink of claim 1, wherein the circuit board has electrical connections thereon and the heat generating component is electrically connected to the circuit board.

5. The heat sink of claim 3, wherein the side edge of the circuit board has a respective outer shape and profile and the mounting flange of the heat sink has substantially the same outer shape and profile as the side edge of the circuit board.

6. The heat sink of claim 5, further comprising a mounting track including means therein shaped for receiving either of the mounting flange and the side edge of the circuit board for mounting the mountable unit to the mounting track.

7. The heat sink of claim 3, wherein the heat sink has substantially the same cross-sectional shape along its length along the side edge of the circuit board.

8. The heat sink of claim 7, including cooling flanges defined on the heat sink for creating a greater surface area of the heat sink.

9. The heat sink of claim 8, wherein the cooling flanges extend longitudinally along the heat sink in the longitudinal direction of the side edge of the circuit board.

10. The heat sink of claim 8, wherein the heat sink is comprised of aluminum.

11. The heat sink of claim 10, wherein the heat sink comprises an extruded aluminum profile of substantially the same cross-sectional shape along its longitudinal direction.

12. The heat sink of claim 9, wherein the heat sink has a third side which is away from the first side thereof with the slot, and the cooling flanges being arranged on the third side of the heat sink; the heat sink having a fourth side opposite the third side, and the fourth side of the heat sink defining a contact surface which contacts the heat generating component.

13. The heat sink of claim 12, wherein the contact surface on the fourth side is a flat contact surface.

14. The heat sink of claim 13, further comprising a longitudinal slot defined in the fourth side of the heat sink and extending along the length of the heat sink; a resilient tensioning element fixed in the slot on the fourth side and engaging the heat generating component and holding the heat generating component against the contact surface.

15. The heat sink of claim 13, further comprising a tensioning element supported by the heat sink and engaging the heat generating component and holding the heat generating component against the contact surface of the circuit board.

16. The heat sink of claim 13, wherein the circuit board has an edge region adjacent the side edge thereof, and the edge region being received in the slot on the first side of the heat sink; the edge region of the circuit board having a plurality of recesses defined in it; the heat sink being deformed at respective areas of the heat sink corresponding to the areas of the recesses in the circuit board when the circuit board is installed in the slot, and the heat sink deformed areas at least partially fill the respective recesses in the circuit board for securely connecting the circuit board to the heat sink.

17. The heat sink of claim 13, wherein the cooling flanges are arranged on one side of the plane that includes the slot of the heat sink and the flat contact surface is located on the opposite side of the plane includes the slot of the heat sink.

18. In combination, the heat sink of claim 3, and a mounting track mounting at least one of the circuit boards, the mounting track receiving the mounting flange of the heat sink, and the mounting flange of the heat sink being received in the track.

19. The combination of claim 18, further comprising the circuit board having a second side edge opposite the first mentioned side edge received in the heat sink, and a second mounting track located at the second side edge of the circuit board and receiving the second side edge of the circuit board, whereby the circuit board second side edge is received in the second mounting track while the mounting flange of the heat sink is received in the first mounting track.

20. The heat sink of claim 2, wherein the mounting flange has the same first width across the mounting flange as the slot.

* * * * *